US009880956B2

(12) United States Patent
Hartwich

(10) Patent No.: US 9,880,956 B2
(45) Date of Patent: Jan. 30, 2018

(54) METHOD AND APPARATUS FOR ADAPTING THE DATA TRANSMISSION SECURITY IN A SERIAL BUS SYSTEM

(75) Inventor: Florian Hartwich, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 741 days.

(21) Appl. No.: 14/110,179

(22) PCT Filed: Mar. 29, 2012

(86) PCT No.: PCT/EP2012/055574
§ 371 (c)(1),
(2), (4) Date: Mar. 19, 2014

(87) PCT Pub. No.: WO2012/136545
PCT Pub. Date: Oct. 11, 2012

(65) Prior Publication Data
US 2014/0201410 A1    Jul. 17, 2014

(30) Foreign Application Priority Data

Apr. 6, 2011 (DE) .................. 10 2011 006 875
Jun. 29, 2011 (DE) .................. 10 2011 078 266
Aug. 5, 2011 (DE) .................. 10 2011 080 476

(51) Int. Cl.
*G06F 13/362* (2006.01)
*G06F 13/42* (2006.01)
(Continued)

(52) U.S. Cl.
CPC ........ *G06F 13/362* (2013.01); *G06F 13/4282* (2013.01); *H03M 13/091* (2013.01);
(Continued)

(58) Field of Classification Search
None
See application file for complete search history.

(56) References Cited

U.S. PATENT DOCUMENTS 5,448,561 A    9/1995  Kaiser et al.
5,559,963 A    9/1996  Gregg et al.
(Continued)

FOREIGN PATENT DOCUMENTS

CN    1433543 A    7/2003
CN    1534422 A    10/2004
(Continued)

OTHER PUBLICATIONS

Vieweg, F., et al. "Bosch Kraftfahrtechnisches Handbuch", 27th Edition, 2011, pp. 852-862, 1074-1084 and 1086-1119.
(Continued)

*Primary Examiner* — Henry Tsai
*Assistant Examiner* — Christopher Bartels
(74) *Attorney, Agent, or Firm* — Norton Rose Fulbright US LLP; Gerard Messina

(57) ABSTRACT

In a bus system that includes at least two subscribed data processing units that exchange messages via a bus in a serial data transmission, the transmitted messages are of a logical structure that includes a start-of-frame bit, an arbitration field, a control field, a data field, a CRC field, an acknowledge field and an end-of-frame sequence, the control field including a data length code, which contains information regarding the length of the data field. The CRC field of the messages can include any of two or more different numbers of bits depending on a value of an associated switchover condition (UB3).

40 Claims, 7 Drawing Sheets

(51) Int. Cl.
  *H04L 12/40* (2006.01)
  *H04L 12/413* (2006.01)
  *H03M 13/09* (2006.01)
  *H04L 1/00* (2006.01)

(52) U.S. Cl.
  CPC ........ *H04L 1/0083* (2013.01); *H04L 12/4013* (2013.01); *H04L 12/40169* (2013.01); *H04L 12/4135* (2013.01); *H04L 1/0061* (2013.01); *H04L 2001/0094* (2013.01); *H04L 2012/40215* (2013.01)

(56) References Cited

U.S. PATENT DOCUMENTS

| | | |
|---|---|---|
| 5,610,945 A | 3/1997 | Gregg et al. |
| 5,734,826 A * | 3/1998 | Olnowich ......... G06F 15/17337 370/410 |
| 5,748,923 A | 5/1998 | Eitrich |
| 6,088,342 A | 7/2000 | Cheng et al. |
| 6,145,024 A | 11/2000 | Maezawa et al. |
| 6,606,670 B1 | 8/2003 | Stoneking et al. |
| 7,100,196 B2 | 8/2006 | Fredriksson |
| 7,146,606 B2 * | 12/2006 | Mitchell ................. 717/141 |
| 7,168,024 B2 | 1/2007 | Farnsworth |
| 7,181,668 B2 | 2/2007 | Ahmed et al. |
| 7,188,207 B2 | 3/2007 | Mitter |
| 7,330,918 B2 | 2/2008 | Yamamoto et al. |
| 7,430,261 B2 | 9/2008 | Forest et al. |
| 7,433,354 B2 | 10/2008 | Scherer et al. |
| 7,512,827 B2 | 3/2009 | Steffan |
| 7,599,377 B2 | 10/2009 | Jordan et al. |
| 7,602,779 B2 | 10/2009 | Kato et al. |
| 7,675,877 B2 | 3/2010 | Lee |
| 7,693,086 B2 | 4/2010 | Honda |
| 7,738,462 B2 | 6/2010 | Hwang |
| 7,801,162 B2 * | 9/2010 | Jeon ........................ H04L 12/66 370/402 |
| 7,826,479 B2 | 11/2010 | Fujimori |
| 7,991,351 B2 | 8/2011 | Kuban |
| 8,320,262 B2 | 11/2012 | Fuehrer et al. |
| 8,324,868 B2 | 12/2012 | Choi et al. |
| 8,351,785 B2 | 1/2013 | Luo et al. |
| 8,352,809 B2 | 1/2013 | Kabulepa et al. |
| 8,375,217 B2 | 2/2013 | Schmidt |
| 8,448,035 B2 | 5/2013 | Yamamoto et al. |
| 8,509,257 B2 | 8/2013 | Yakashiro |
| 8,560,125 B2 | 10/2013 | Wallaert et al. |
| 8,705,527 B1 * | 4/2014 | Addepalli ............. H04W 4/046 370/389 |
| 8,774,210 B2 | 7/2014 | Grohman |
| 9,032,124 B2 | 5/2015 | Elend et al. |
| 9,088,433 B2 | 7/2015 | Roettgermann et al. |
| 9,091,551 B2 | 7/2015 | Hannan et al. |
| 9,209,942 B2 | 12/2015 | Takada et al. |
| 2002/0041688 A1 | 4/2002 | Fredriksson et al. |
| 2004/0015603 A1 | 1/2004 | Griessbach et al. |
| 2004/0228366 A1 * | 11/2004 | Fuehrer ................. H04L 1/0083 370/489 |
| 2005/0010762 A1 | 1/2005 | Schmidt |
| 2005/0086571 A1 | 4/2005 | Farnsworth |
| 2005/0141565 A1 * | 6/2005 | Forest ................... H04J 3/0652 370/503 |
| 2005/0254518 A1 * | 11/2005 | Fujimori ................. H04L 69/08 370/466 |
| 2006/0037008 A1 | 2/2006 | Stelzer et al. |
| 2007/0091932 A1 | 4/2007 | Hwang |
| 2007/0189323 A1 | 8/2007 | Swoboda et al. |
| 2008/0274689 A1 * | 11/2008 | Kuban ...................... H04L 1/16 455/7 |
| 2009/0192051 A1 | 7/2009 | Carman |
| 2009/0206798 A1 | 8/2009 | Choi et al. |
| 2009/0322492 A1 | 12/2009 | Hannan et al. |
| 2010/0106810 A1 | 4/2010 | Grohman |
| 2010/0131816 A1 | 5/2010 | Yamamoto et al. |
| 2010/0150176 A1 | 6/2010 | Yakashiro |
| 2010/0158045 A1 | 6/2010 | Shin et al. |
| 2011/0125940 A1 | 5/2011 | Aue et al. |
| 2012/0233500 A1 * | 9/2012 | Roettgermann .... G06F 11/3636 714/25 |
| 2012/0307836 A1 | 12/2012 | Ishigooka et al. |
| 2013/0166800 A1 | 6/2013 | Bosse et al. |
| 2014/0334300 A1 | 11/2014 | Horihata et al. |

FOREIGN PATENT DOCUMENTS

| | | |
|---|---|---|
| CN | 1860742 A | 11/2006 |
| CN | 101018179 A | 8/2007 |
| CN | 101057295 A | 10/2007 |
| CN | 101208674 A | 6/2008 |
| CN | 101572641 A | 11/2009 |
| CN | 101626333 A | 1/2010 |
| CN | 101814230 A | 8/2010 |
| CN | 101873299 A | 10/2010 |
| CN | 101884196 A | 11/2010 |
| DE | 103 11 395 | 9/2004 |
| DE | 10 2004 055 684 | 5/2006 |
| DE | 10 2007 051 657 | 4/2009 |
| JP | 2001-339412 A | 12/2001 |
| JP | 2010-258990 A | 11/2010 |
| JP | 2010-272971 A | 12/2010 |
| RU | 2 337 497 C2 | 10/2008 |
| RU | 2 364 040 C2 | 8/2009 |
| TW | 200941974 A | 10/2009 |
| WO | 2013/000916 A1 | 1/2013 |

OTHER PUBLICATIONS

ISO 16845: Road Vehicles—Controller Area Network (CAN)—Conformance Test Plan, 2004.
ISO 11898-1-5: Road Vehicles—Controller Area Network (CAN)—Part 5: High-speed Medium Access Unit with Low-power Mode, 2007.
International Search Report, PCT International Application No. PCT/EP2012/055574, dated Aug. 9, 2012.
"Road Vehicles-Controller Area Network (CAN)—Part 1: Data Link Layer and Physical Signalling; ISO 11898-1-2003", IEEE Draft; ISO+11898-1-2003, IEEE-SA, Nov. 18, 2010, pp. 1-52.
G. Cena and A. Valezano "Overlocking of controller area networks" Electronics Letters, vol. 35, No. 22 (1999).
International Standard ISO 11898-1:2003/Cor.1:2006 Road Vehicles—Controller area network (CAN)—Part 1: Data link layer and physical signaling, (2006) pp. 1-6.
International Standard ISO 11898-2:2003 Road Vehicles—Controller area network (CAN)—Part 2: High-speed medium access unit, (2003), pp. 1-21.
International Standard ISO 11898-3:2006 Road Vehicles—Controller area network (CAN)—Part 3: Low-speed, fault-tolerant, medium-dependent interface, (2006).
International Standard ISO 11898-4:2004 Road Vehicles—Controller area network (CAN)—Part 4: Time-triggered communication, (2004), pp. 1-32.
Unruh, et al. "Error Detection Analysis of Automotive Communication Protocols" SAE transactions 99.6, (1990) pp. 976-985, Detroit, USA.—only in 8414.

* cited by examiner

Standard Format

Extended Format

SOF = Start Of Frame
RTR = Remote Transmission Request
SRR = Substitute Remote Request
IDE = Identifier Extension Bit Standard Format Extended Format

| DLC | Norm CAN | DLC 1 | DLC 2 | DLC 3 | DLC 4 |
|---|---|---|---|---|---|
| 0000 | 0 (not used) | 0 (not used) | 16 | remote f. | remote f. |
| 0001 | 1 | 1 | 1 | 1 | 2 |
| 0010 | 2 | 2 | 2 | 2 | 4 |
| 0011 | 3 | 3 | 3 | 3 | 6 |
| 0100 | 4 | 4 | 4 | 4 | 8 |
| 0101 | 5 | 5 | 5 | 5 | 10 |
| 0110 | 6 | 6 | 6 | 6 | 12 |
| 0111 | 7 | 7 | 7 | 7 | 14 |
| 1000 | 8 | 8 | 8 | 8 | 16 |
| 1001 | 8 | 9 | 9 | 10 | 18 |
| 1010 | 8 | 10 | 10 | 12 | 20 |
| 1011 | 8 | 11 | 11 | 14 | 22 |
| 1100 | 8 | 12 | 12 | 16 | 24 |
| 1101 | 8 | 13 | 13 | 18 | 26 |
| 1110 | 8 | 14 | 14 | 20 | 28 |
| 1111 | 8 | 15 | 15 | 24 | 30 |

Fig. 2

Standard Format

Extended Format

Standard Format CAN FD „Fast"

Extended Format CAN FD „Fast"

METHOD AND APPARATUS FOR ADAPTING THE DATA TRANSMISSION SECURITY IN A SERIAL BUS SYSTEM

FIELD OF THE INVENTION

The present invention relates to a method and a device for adapting the data transmission reliability between at least two subscribers in a serial bus system.

BACKGROUND

The ISO standard family 11898-1 through -5, for example, describes a Controller Area Network (CAN) as well as an extension of the CAN called "time-triggered CAN" (TTCAN), referred to in the following also as standard CAN. The media access control method used in the CAN is based on a bit-wise arbitration. In bit-wise arbitration, multiple subscriber stations are simultaneously able to transmit data via the channel of the bus system, without thereby interfering with the data transmission. Furthermore, the subscriber stations are able to ascertain the logical state (0 or 1) of the channel while transmitting a bit over the channel. If a value of the transmitted bit does not correspond to the ascertained logical state of the channel, the subscriber station terminates the access to the channel. In CAN, the bit-wise arbitration is usually carried out on the basis of an identifier within a message that is to be transmitted via the channel. After a subscriber station has sent the identifier to the channel in its entirety, it knows that it has exclusive access to the channel. The end of the transmission of the identifier thus corresponds to a beginning of an enable interval, within which the subscriber station is able to use the channel exclusively. According to the CAN protocol specification, other subscriber stations may not access the channel, that is, send data to the channel, until the sending subscriber station has transmitted a checksum field (CRC field) of the message. Thus, an end point of the transmission of the CRC field corresponds to an end of the enable interval.

The bit-wise arbitration thus achieves a non-destructive transmission, via the channel, of those messages that won the arbitration process. The CAN protocols are particularly suited for transmitting short messages under real-time conditions, a suitable assignment of the identifiers being able to ensure that particularly important messages will almost always win the arbitration and be sent successfully.

With the increasing networking of modern vehicles and the introduction of additional systems for improving driving safety for example or driving comfort, the demands grow on the quantities of data to be transmitted and the latency periods admissible in the transmission. Examples are driving dynamics control systems such as, e.g., the electronic stability program ESP, driver assistance systems such as, e.g., the automatic distance control ACC, or driver information systems such as, e.g., the traffic sign detection (cf. for example descriptions in "Bosch Kraftfahrtechnisches Handbuch," 27th edition, 2011, Vieweg+Teubner).

DE 103 11 395 A1 describes a system in which asynchronous, serial communication is able to take place alternatively via an asymmetrical physical protocol or via the symmetrical physical CAN protocol, and thereby a higher data transmission rate or data transmission reliability is achievable for the asynchronous communication.

DE 10 2007 051 657 A1 provides for the use of an asynchronous, fast, non CAN-compliant data transmission in the exclusive time windows of the TTCAN protocol in order to increase the transmitted data quantity.

G. Cena and A. Valenzano, in "Overclocking of controller area networks" (Electronics Letters, vol. 35, No. 22 (1999), p. 1924) deal with the effects of overclocking the bus frequency in subsections of the messages on the effectively achieved data rate. The adaptation of data transmission reliability is not discussed.

It is clear that the related art does not provide results that are satisfactory in every respect.

SUMMARY

The present invention is based on the transmission of messages being of a logical structure according to the CAN standard ISO 11898-1 in a bus system that includes at least two subscribed data processing units, the logical structure including a start-of-frame-bit, an arbitration field, a control field, a data field, a CRC field, an acknowledge field and an end-of-frame sequence, and the control field including a data length field, which contains an item of information regarding the length of the data field.

According to an example embodiment, for certain transmitted messages, the present invention provides an option to use a modified polynomial for calculating a checksum and to transmit a CRC field of a size that deviates from the CAN standard in that the CRC field of the messages may have any of at least two different numbers of bits depending on the value of an associated switchover condition. This makes it possible, as a function of the switchover condition, to adapt the data transmission to the respective data transmission task, for example to the scope or the security relevance of the transmitted data, and thus to influence or define the data transmission reliability. For this purpose, according to an example embodiment, advantageously at least two different generator polynomials are used for defining the content of the CRC field as a function of the value of the associated switchover condition.

Regarding the use of the method according to the present invention and the corresponding devices even in conventional CAN networks, it is advantageous if, for at least one value of the associated switchover condition, the number of bits in the CRC field and the generator polynomial used for defining the content of the CRC field correspond to the CAN standard ISO 11898-1.

In an example embodiment, the corresponding messages are detectable by a suitable identification in the arbitration field and/or in the control field. This allows the subscriber units receiving the message to recognize the messages modified in accordance with the present invention and to adapt their receiving process accordingly. This can be advantageous if the content of the data length code is also used for this adaptation.

In an example embodiment, multiple calculations of checksums are started in parallel at the beginning of a message and, as a function of the satisfaction of an associated switchover condition and/or the content of the data length code, a decision is made as to the result of which of these calculations is used or transmitted in the CRC field. This makes it possible to transmit the information as to whether a message is transmitted according to the standard-conforming method or according to the method modified in accordance with the present invention along with the message, without informing the recipient in advance about the used method. The checksums for checking the correct data transmission exist for both methods and may be evaluated as needed.

By providing a possibility of enlarging the data field of a transmitted message, an example embodiment of the present invention achieves the effect that, compared to a standard-conforming CAN message, a greater quantity of data may be transmitted over the bus in a single message. This advantageously increases the ratio of data quantity and control information in a message and thus also the average data transmission rate over the bus system. The combination with the adaptation of the CRC field according to the present invention has the advantage that the reliability of error detection is maintained or may be adapted even for larger transmitted data quantities.

By establishing an unequivocal correlation between the content of the data length code and the length of the data field, a high flexibility is advantageously achieved with respect to the possible size of the data field.

It is furthermore advantageous that, for the values 0b0001 through 0b1000 of the data length code normally used in standard CAN, the sizes of the data field corresponding to the CAN standard, that is, 1 byte through 8 bytes, are assigned and the remaining values of the data length code are used for the additional admissible sizes of the data field up to the maximum admissible size. This cost-effectively reduces the adaptation effort of application software when switching to the method according to the present invention.

The use of a modified polynomial for calculating the checksum occurs as a function of a switchover condition such that, when the switchover condition is satisfied, the method according to the present invention is applied, while, otherwise, the data transmission occurs according to the normal CAN standard. Also advantageously, the enlargement of the data field and the adaptation of the interpretation of the content of the data length code likewise occur as a function of a, for example the same, switchover condition. This makes it possible to use devices according to the present invention both in standard CAN bus systems as well as in new bus systems according to the present invention with potentially greater data fields.

The satisfaction of the switchover conditions is communicated to the recipients by one or multiple identifiers. For example, according to an advantageous example embodiment, at least one of the identifications occurs by a first identification bit, the position of which is between the last bit of the identifier and the first bit of the data length code and at the position of which, in messages according to the CAN standard ISO 11898-1, there is a bit having a defined value.

It is furthermore advantageous that possibly existing stuff bits, which appear before the CRC field in the message, are also included in the calculation of the checksum. This further improves the reliability of the data transmission or the detection probability for data transmission errors.

If the method is further combined with a switchover of the bit length, for example for at least the bits of the data field and the CRC field, then a further advantage is obtained that a greater quantity of data is transmitted in accelerated fashion than is the case when the data field is limited to 8 bytes. This further increases the average data transmission rate of the bus system. In one advantageous development, the messages of a shortened bit length are in this case identified by another identification bit, which is located between the first identification bit and the first bit of the data length code. This allows the switchover of the bit length to occur independently of the switchover of the CRC calculation or the size of the data field, and it is possible to react flexibly to the prevailing conditions of the bus system.

The method is advantageously applicable in the normal operation of a motor vehicle for transmitting data between at least two control units of the motor vehicle, which are connected via a suitable data bus. It may equally be used advantageously during the manufacturing or maintenance of a motor vehicle for transmitting data between a programming unit connected to a suitable data bus for programming purposes and at least one control unit of the motor vehicle that is connected to the data bus. It is also advantageously usable in the industrial field when larger data quantities must be transmitted for example for control purposes. Particularly if a reduced data rate must be applied during the arbitration due to the length of the transmission route so that all subscribers have the opportunity to access the bus, the method makes it possible, in particular in combination with the switchover of the length of the data field and the reduction of the bit length, to achieve a higher data transmission rate.

An additional advantage is that a standard CAN controller only needs to be modified minimally in order to be able to operate in accordance with the present invention. A communications controller according to the present invention, which is also able to work as a standard CAN controller, is only negligibly larger than a conventional standard CAN controller. The associated application program does not need to be modified, and even then advantages in the speed of data transmission are already achieved.

Advantageously, substantial portions of the CAN conformance test (ISO 16845) may be adopted. In one advantageous development, the transmission method according to the present invention may be combined with the supplements of TTCAN (ISO 11898-4).

In the following, the present invention and its advantages will be described with reference to drawings and example embodiments. The subject matter of the present invention is not limited to the represented and described example embodiments.

BRIEF DESCRIPTION OF THE DRAWINGS

FIG. 2 represents various possibilities of how the content of the data length code may be interpreted in a manner deviating from the CAN standard ISO 11898-1, according to an example embodiment of the present invention.

DETAILED DESCRIPTION

Figure 1A:
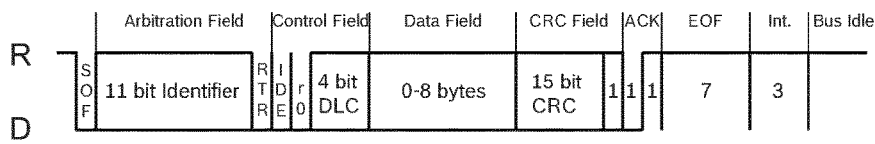
FIG. 1a shows the two alternatives for the structure of messages in the CAN format according to the CAN standard ISO 11898-1 from the related art.
Figure 1A:
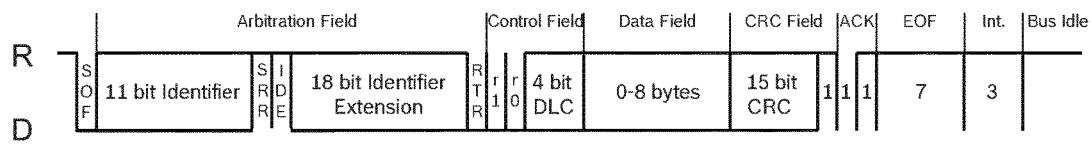

FIG. 1a shows the structure of messages as they are used in a CAN bus for data transmission. The two different formats "standard" and "extended" are shown. The method according to the present invention is applicable to both formats.

The message begins with a "start of frame" (SOF) bit, which signals the beginning of the message. This is followed by a section that is used primarily for identifying the message and on the basis of which the subscribers of the bus system decide whether they receive the message or not. This section is called an "arbitration field" and contains the identifier. This is followed by a "control field" containing, among other things, the data length code. The data length code contains information about the size of the data field of the message. This is followed by the actual "data field," which contains the data to be exchanged between the subscribers of the bus system. This is followed by the "CRC field" including the 15-bit checksum and a delimiter, and subsequently two "acknowledge" (ACK) bits, which signal to the sender the successful reception of a message. The message is concluded by an "end of frame" (EOF) sequence.

In the standard CAN transmission method, the data field may contain a maximum of 9 bytes, that is, 64 bits of data. According to the standard, the data length code comprises four bits, which is to say that it can assume 16 distinct values. Of this value range, in today's bus systems, only eight different values are used for the various sizes of the data field from 1 byte to 8 bytes. A data field of 0 bytes is not recommended in standard CAN, and sizes above 8 bytes are not permitted. The assignment of the values of the data length code to the sizes of the data field is shown in FIG. 2 in the Norm CAN column.

Figure 1B:
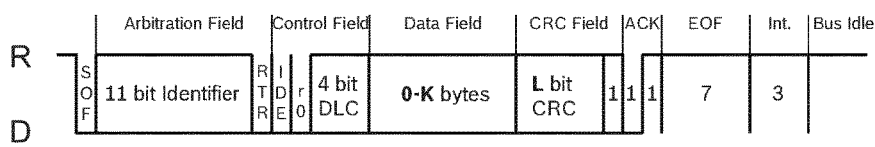
FIG. 1b shows analogous alternatives for the format of the respective messages of FIG. 1a, modified in accordance with an example embodiment of the present invention.
Figure 1B:
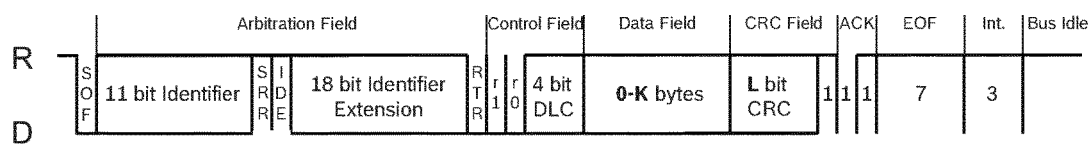

In FIG. 1b, in a representation that is analogous to that shown in FIG. 1a, modified messages to be transmitted in accordance with an example embodiment of the present invention are juxtaposed, respectively derived from the two standard formats.

In the transmission method modified in accordance with the present invention, the data field may contain more than 8 bytes, namely, in the represented embodiment, up to K bytes. In contrast to standard CAN, additional values assumable by the data length code are used to identify larger data fields. For example, the four bits of the data length code may be used to represent the values from zero to 15 bytes. Other assignments may also be made, however, one possibility being the use the value of the data length code DLC=0b0000, which is normally not used in today's CAN messages, for another possible size of the data field, for the size of 16 bytes for example. These two possibilities are shown in FIG. 2 in tabular form as DLC 1 and DLC 2. The maximum size of data field K in this case has the value 15 and 16, respectively.

Another possibility is that, for the values of the data length code greater than 0b1000 and up to 0b1111, the associated sizes of the data field grow respectively by 2 bytes for example. This case is shown in the table as DLC 3. The maximum size of data field K in this variant reaches the value 24. By selecting a greater increment, for example 4 bytes, greater data fields would be achievable accordingly.

In the DLC 3 example, an additional modification has been made: the value DLC=0b0000 is used in this example embodiment by remote frames. Standard CAN, by contrast, provides for transmitting a remote frame at the same value of the DLC as the message transmitted as a reaction to the remote frame. The modification described here ensures that remote frames having a different DLC and an identical identifier cannot be transmitted, which (cf. ISO 11898-1, chap. 10.8.8) may result in inextricable collisions.

In the embodiments of the method shown in tabular form in FIG. 2 in columns DLC 1, DLC 2 and DLC 3, the assignment of the values from 0b0001 through 0b1000 of the data length code to the sizes of the data field between 1 byte and 8 bytes corresponds to the assignment in standard CAN. In a simple manner, this makes it possible to achieve compatibility to standard CAN, that is, to design the communications controller in such a way that it works in a standard-conforming manner in a standard CAN bus system, while allowing greater data fields in the messages in a bus system modified in accordance with the present invention. It is also possible, however, to perform a completely new assignment of the possible values of the data length code to admissible sizes of the data field. An example of this is provided as DLC 4 in FIG. 2. In this case, the achieved maximum size K of the data field is 30 bytes.

To ensure that such a communications controller is able to determine in what manner it must interpret the contents of the data length code, it is advantageous for the communications controller to recognize independently whether the communication of the bus system occurs according to standard CAN or according to the method of the present invention. According to an example embodiment, this is achieved by using a reserved bit within the arbitration field or the control field for identification such that, from this first identification K1, the communications controller is able to derive a first switchover condition UB1, on the basis of which it selects the transmission method. For example, the second bit of the control field indicated by r0 in FIG. 1b may be used for identification.

According to an alternative example embodiment, the determination is selected as a function of the identifier format. For standard addressing, one option for identifying the messages according to the present invention is thus to insert a recessive EDL (extended data length) bit into the control field in the position of the r0 bit that is always dominant in standard CAN. For extended addressing, the recessive EDL bit in the control field can take the position of the r1 bit that is always dominant in standard CAN.

An alternative example embodiment uses the SRR bit, which in standard CAN must always be transmitted recessively, but which is accepted also dominantly by the bus subscribers receiving the message. It is also possible to evaluate bit combinations to determine the first switchover condition UB1.

According to an alternative example embodiment, the use of the extended format is prescribed for the transmission method modified in accordance with the present invention. Messages in the extended format are recognized by bus subscribers on the basis of the value of the IDE bit (cf. FIG. 1a), and this bit could at the same time represent the first switchover condition UB1 such that the modified transmission method is always used for extended messages. Alternatively, it would also be possible in extended messages to use the reserved bit r1 as a first identification K1 or for deriving the first switchover condition UB1. As explained further below, the reserved bit may also be used for deriving a second switchover condition UB2 for switching between more than two different sizes of the data field or assignments between values of the data length code and data field sizes.

It is also possible to apply the method in suitable communications controllers that are not also designed for standard-conforming CAN communication. In this case, the determination of the mentioned first switchover condition UB1, for example as a function of a suitable identification K1 of the messages, may also be dropped. In this case, the communications controllers rather operate exclusively according to one of the described methods and are accordingly usable only in bus systems in which such communications controllers according to the present invention are used exclusively.

If, as provided in the present invention, the data field of messages is enlarged, then, according to an example embodiment, the method utilized for the cyclic redundancy check (CRC) is adapted in order to obtain a sufficient immunity against error. In particular, it may be advantageous to use a different CRC polynomial, for example of a higher order, and accordingly to provide a CRC field of a deviating size in the messages modified in accordance with the present invention. This is indicated in FIG. 1b by the fact that the CRC field of the messages of the present invention has a length of L bits in the example provided, it being possible for L to be unequal to, in particular greater than, 15, in deviation from standard CAN.

The use of a modified method for calculating the CRC checksum may be signaled to the bus subscribers by a third identification K3, which represents a third switchover condition UB3. This identification K3 and the third switchover condition UB3, however, may also agree with the first identification K1 and/or switchover condition UB1. Here too, as was described further above, the reserved bit r0 from FIG. 1b may be used for identification for example, or the SRR bit may be used. A use of the IDE bit in combination with the application of the method in extended messages or even of the r1 bit is also possible.

In standard CAN controllers, the CRC code of CAN messages to be transmitted is generated by a feedback shift register, the serially transmitted bits of the message being fed sequentially into its input. The width of the shift register corresponds to the order of the CRC polynomial. The CRC encoding occurs by combining the register content with the CRC polynomial during the shift operations. When CAN messages are received, the serially received bits of the message are accordingly shifted into the CRC shift register. The CRC test is successful if at the end of the CRC field all bits of the shift register are at zero. The CRC code generation in the sending case and the CRC test in the receiving case both occur in hardware without requiring an intervention of the software. A modification of the CRC encoding thus does not affect the application software.

In the standard CAN protocol, the stuff bits within the CAN messages (cf. ISO 11898-1, chap. 10.5) are not included in the calculation or checking of the CRC code (cf. ISO 11898-1, chap. 10.4.2.6: " . . . the bit stream given by the destuffed bit sequence . . . "). This has the consequence that in rare cases two bit errors in one message are not detected even though the CRC should as such detect up to five randomly distributed bit errors in one message. This may occur when, as a result of the bit errors, stuff bits transform into data bit and vice versa (cf. Unruh, Mathony and Kaiser, "Error Detection Analysis of Automotive Communication Protocols," SAE International Congress, No. 900699, Detroit, USA, 1990).

In the transmission method modified in accordance with the present invention, by contrast, the CRC encoding may be changed in such a way that the stuff bits within the message are also included in the calculation or checking of the CRC codes. That is, in this specific embodiment, the stuff bits belonging to the arbitration field, control field and data field are treated as part of the data to be protected by the cyclic redundancy check. As in standard CAN, the stuff bits of the CRC field are disregarded.

In an example embodiment, the communications controller is designed in such a way that it is compatible with the standard CAN, that is, it works in a standard-conforming fashion in a standard CAN bus system, while, in a bus system modified in accordance with the present invention, it allows for larger data fields in the messages and also performs the adapted calculation and checking of the CRC code.

Since, at the start of the reception of a message, it is not yet clear whether a standard-conforming CAN message or a message modified in accordance with the present invention is received, two CRC shift registers are implemented in a communications controller according to the present invention, which shift registers work in parallel. Following the reception of the CRC delimiter, when the CRC code is evaluated in the receiver, it is clear from the third identification K3 according to the present invention or from the third switchover condition UB3 derived from the identification or the content of the data length code, for example, which transmission method was used, and the shift register associated with this transmission method is then evaluated. As already explained above, the third switchover condition UB3 may agree with the first switchover condition UB1, which concerns the size of the data field and the interpretation of the data length code.

To be sure, it is already clear for the sender at the beginning of sending a message according to which transmission method a transmission is to occur. Since it could happen, however, that the arbitration regarding bus access is lost and the started message is not sent, but instead a different message is received, both CRC shift registers are activated in parallel in this case as well.

The described implementation of two CRC shift registers working in parallel also allows for another improvement, as follows. The CRC polynomial of the standard CAN protocol ($x15+x14+x10+x8+x7+x4+x3+1$) is designed for a message length of less than 127 bits. If messages transmitted in accordance with the present invention also use longer data fields, then it is practical to use a different, in particular longer, CRC polynomial in order to maintain transmission reliability. The messages transmitted in accordance with the present invention accordingly receive a modified, in particular longer, CRC field. In ongoing operation, the communications controllers switch dynamically between the two CRC shift registers, that is, between the standard CAN-conforming shift register and the shift register of the present invention, in order to use the respectively fitting polynomial.

Of course, more than two shift registers and accordingly more than two CRC polynomials may also be used, graduated as a function of the length of the data field or the desired transmission reliability. In this case, if a compatibility with the standard CAN is to be maintained, the corresponding identification and the associated switchover condition must be adapted. For example, a first switchover condition UB1 could be triggered by the reserved r0 bit or the SRR bit in FIG. 1b, which indicates a switchover to longer data fields, for example according to DLC 1 in FIG. 2, and an associated second CRC polynomial. For messages in the extended format, additionally a second switchover condition UB2 could be triggered, for example indicated by the reserved bit r1 or the IDE bit in FIG. 1b (second identification K2), which indicates the switchover to another set of data field sizes, for example DLC 3 from FIG. 2, and a third CRC polynomial.

It is also possible that first switchover condition UB1 switches over to the option of longer data fields and the corresponding interpretation of the content of the data length code, perhaps via the reserved bit r0 or the SRR bit, and that the ascertainment of the third switchover condition UB3 and accordingly the selection of the CRC polynomial to be evaluated for the CRC check then occurs as a function of the content of the data length code. Third switchover condition UB3 may accordingly also assume more than two values. For example, the data field sizes could be selected according to DLC 3, that is, assume the values 0 (for remote frames) 1, . . . , 8, 10, 12, 14, 16, 18, 20 and 24 bytes, and three CRC polynomials could then be calculated in parallel via suitable shift registers, for example the standard CRC polynomial for data fields up to 8 bytes, a second CRC polynomial for data fields up to 16 bytes and a third CRC polynomial for data fields up to 24 bytes.

Figure 3:
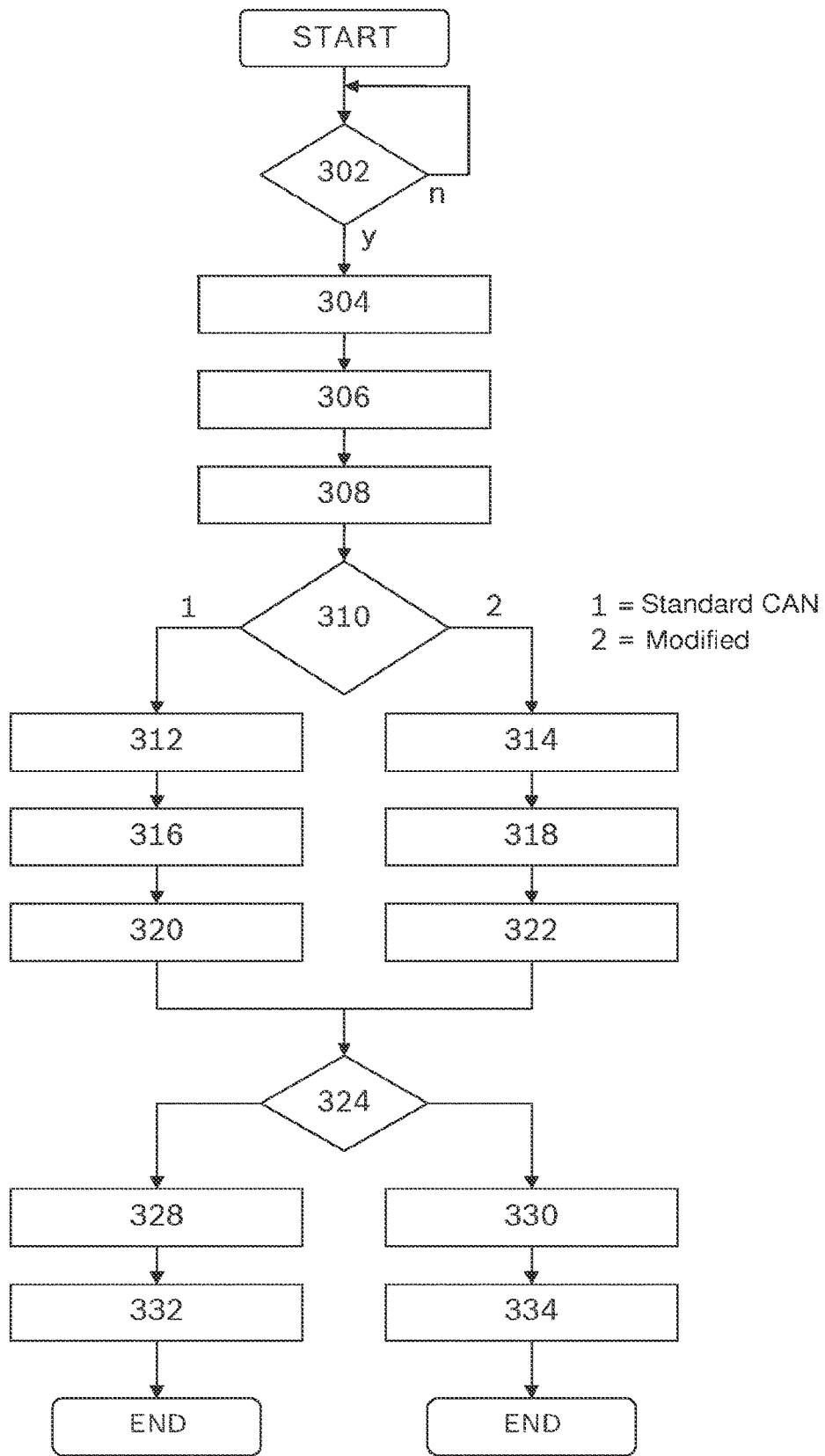
FIG. 3 schematically shows a receiving process in a subscriber station of the bus system, according to an example embodiment of the present invention.

FIG. 3 shows, in a simplified representation, a segment of the receiving process according to an example embodiment of the present invention, as it occurs in a subscriber station of the bus system. The case shown is one in which a compatibility with the standard CAN is achieved in that the behavior of the communications controller is adapted as a function of the first switchover condition UB1. Although FIG. 3 shows a representation typical for describing program runs in software, the method is also suitable for implementation in hardware.

The subscriber station is first in a bus-scanning state as long as there is no communications traffic on the bus. Query 302 is thus waiting for a dominant bit on the bus. This bit marks the start of a new message.

As soon as the start of a new message has been determined, the calculation of the at least two checksums to be calculated in parallel begins in Block 304. The first checksum corresponds to the CRC calculation of the standard CAN, while the second checksum is calculated according to the new method. In the calculation of the second checksum, the stuff bits are included in the example embodiment shown, whereas this is not the case in the calculation according to the standard CAN. It is also possible, however, not to take the stuff bits into account even for calculating the second checksum, similar to the standard CAN.

Subsequently, beginning with step 306, the additional bits of the message following the SOF bit are received, beginning with the arbitration field. If multiple bus subscribers want to send out a message, then the bus subscribers negotiate among themselves in accordance with the usual method of the standard CAN which bus subscriber gains the access to the bus. Block 306 indicates the reception of all bits until first identification K1 has been received or first switchover condition UB1 has been determined. In the examples listed, first switchover condition UB1 is ascertained from the arbitration field, for example from the SRR bit or the IDE bit, or from the control field, for example from a reserved bit of the same (cf. FIG. 1). Subsequently, additional bits of the message may be received in block 308 until, beginning with a specific bit of the message as a function of the ascertained first switchover condition UB1, a different method is followed. This split into different methods is ensured by a corresponding query or branching 310, as shown in the following by way of example.

If it is known at branching 310, for example following the reception of the first two bits of the control field, that, according to first switchover condition UB1, the communication occurs in accordance with the CAN standard (the path of FIG. 3 indicated by "1"), then the additional bits of the control field are read in in step 312. From these bits, the data length code is evaluated according to the CAN standard and subsequently, in step 316, the associated set of data, 8 bytes maximum, is received in accordance with the data field. The 15-bit CRC field is then received in step 320. If it is known at branching 324 that the CRC checksum transmitted by the sender agrees with the CRC checksum ascertained by the receiver, then a dominant acknowledge bit is transmitted in block 328. It should be noted that in this case the standard-conforming CRC checksum is compared since the communication occurs according to the CAN standard. If no agreement is ascertained, the acknowledge bit is transmitted recessively (Block 330). This is followed by the ACK delimiter and EOF bits (see FIG. 1b, not shown in FIG. 3).

If, by contrast, it is known at branching 310, for example following the reception of the first two bits of the control field, that, according to first switchover condition UB1, the communication method modified in accordance with the present invention is to be applied (the path of FIG. 3 indicated by "2"), then the additional bits of the control field are read in in step 314. From the result, the data length code is ascertained according to the new interpretation, for which some examples are listed in tabular form in FIG. 2. In block 318, the corresponding quantity of data is received, that is, up to 15 bytes for the example DLC 1 from the table in FIG. 2, up to 16 bytes for the example DLC 2, up to 24 bytes for the example DLC 3, and up to 30 bytes for the example DLC 4. The CRC field deviating in accordance with the present invention, being in particular longer, is received in block 322. If it is known at branching 324 that the CRC checksum transmitted by the sender agrees with the CRC checksum ascertained by the receiver, then a dominant acknowledge bit is transmitted in block 328, the comparison in this case being based on the CRC checksum that deviates in accordance with the present invention. Otherwise, the acknowledge bit is transmitted recessively (Block 330). The ACK delimiter and the EOF bits follow in step 332 or 334. This ends a receiving process for a message.

Figure 4:
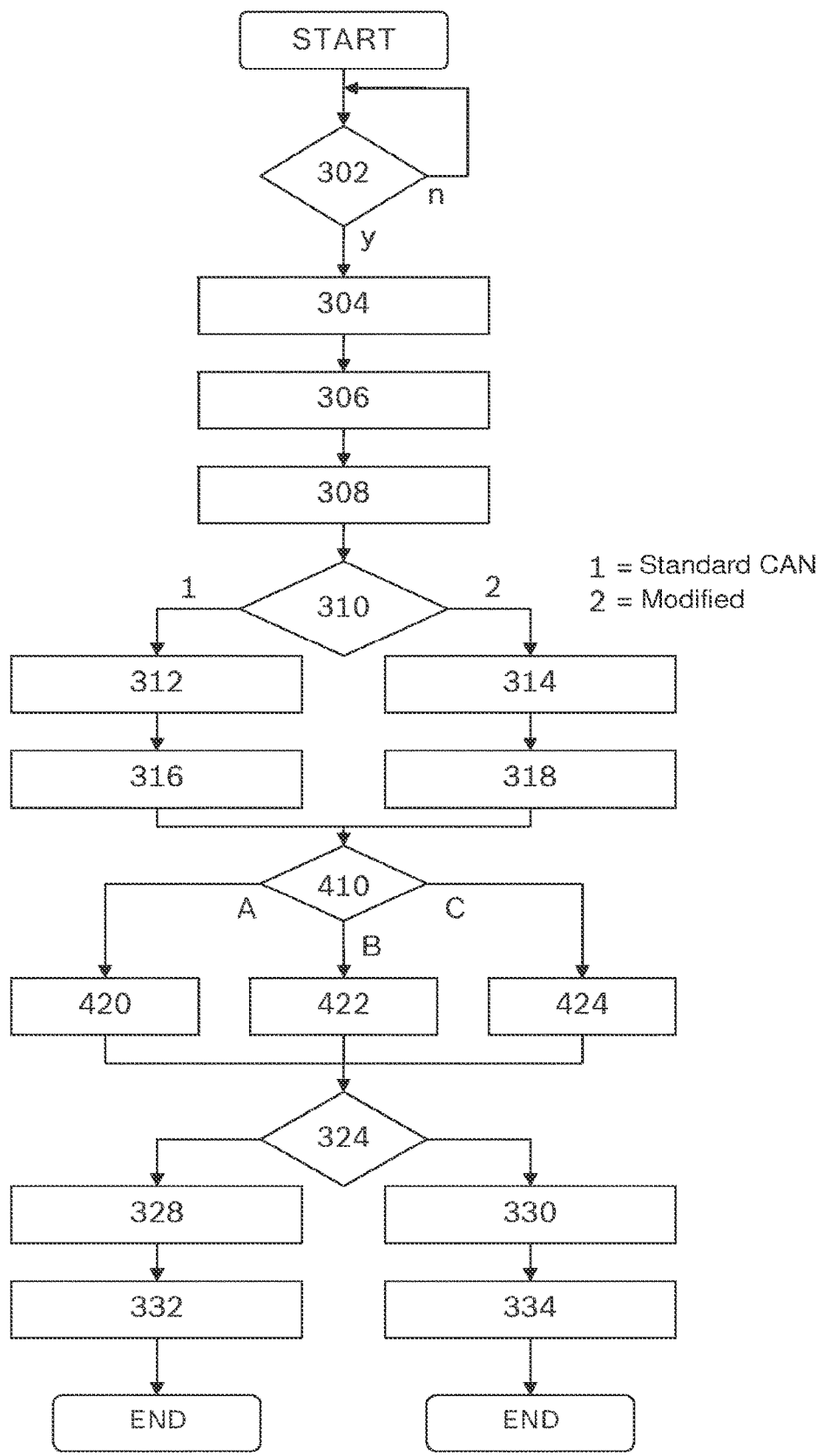
FIG. 4 schematically shows a receiving process in a subscriber station of the bus system, according to another example embodiment of the present invention.

FIG. 3 shows the case in which third switchover condition UB3, which determines the CRC to be used, agrees with first switchover condition UB1, which concerns the size of the data field and the interpretation of the data length code. Thus, prior to the reception 320 or 322 of the CRC checksums, no additional query was made as to which CRC is to be received according to the third switchover condition UB3 and to be evaluated for branching 324. As shown in FIG. 4, this additional query may be integrated into the process by a simple modification of the flow chart from FIG. 3.

In the reception process modified in this manner, as shown in FIG. 4, following the reception of the number of data bytes of the data field expected according to the information from the data length code, query or branching 410 ascertains the value of switchover condition UB3 in block 316 or 318. As described earlier, this information may have been ascertained for example from the corresponding third identification K3 or from the content of the data length code. In the example shown, there are three different values for third switchover condition UB3: A, B and C. Depending on the value of switchover condition UB3, a different number of bits of the CRC field is then read in in blocks 420, 422 and 424, for example 15 bits for the value A, 17 bits for the value B and 19 bits for the value C. Subsequently, a check is performed in branching 324 analogous to FIG. 3 whether the CRC checksum transmitted by the sender agrees with the CRC checksum ascertained by the receiver, and the further method is selected accordingly.

Figure 5:
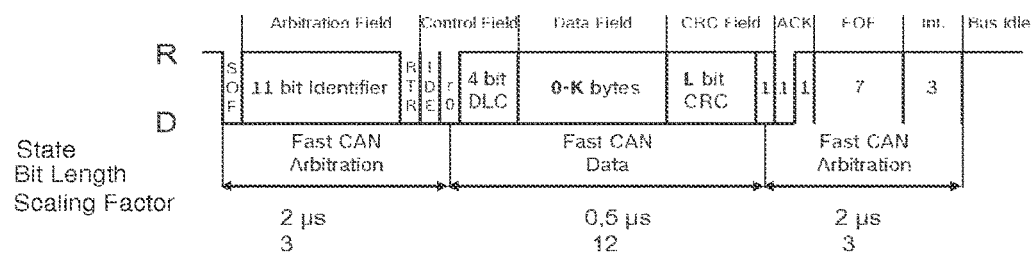
FIG. 5 shows two examples of the present invention for the format of messages, in which additionally a different bit length is used in defined areas within the message.
Figure 5:
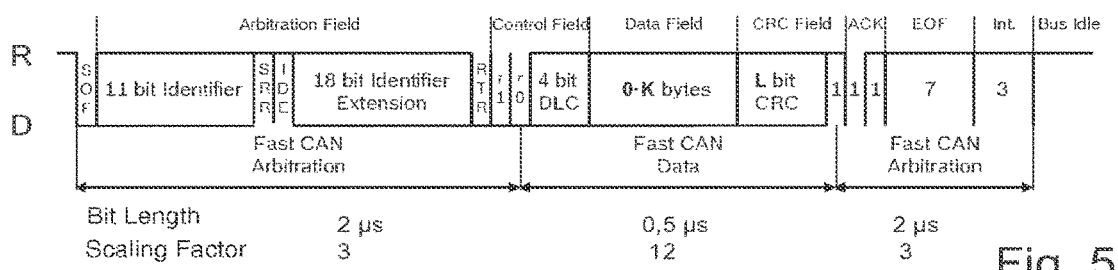

FIG. 5 shows once more the structure of messages in the two possible variants, the standard format and the extended format, for an additional example embodiment of the transmission method according to the present invention. Areas are drawn for both variants in FIG. 5, in which a switchover is made between two states, here indicated as Fast CAN Arbitration and Fast CAN Data. This switchover between the two states in this example has the effect that following the conclusion of the arbitration, the bit lengths are shortened for a portion of the message, in particular for the data field and the CRC field, and thus the individual bits are transmitted via the bus more quickly. This makes it possible to shorten the transmission time for a message compared to the standard-conforming method. The associated change in the bit length in time may be implemented by using at least two different scaling factors for setting the bus time unit relative to a smallest time unit or the oscillator clock pulse in ongoing operation. The switchover of the bit length, as well as the corresponding change of the scaling factor, are shown in FIG. 5 also by way of example.

The transition between the states of Fast CAN Arbitration and Fast CAN Data may occur as a function of a fourth switchover condition UB4, which corresponds to a fourth identification K4 of the messages, which signals to the subscribers of the data transmission that the shortened bit length is used. In the example embodiment shown here, the chosen position of this identification K4 is the "reserved bit" r0, which is transmitted before the data length code. It thus corresponds to a possible position of first identification K1, which corresponds to first switchover condition UB1 and indicates the possible use of longer data fields and a modified interpretation of the data length code, and also of third identification K3, which corresponds to a modified CRC calculation.

Figure 6:
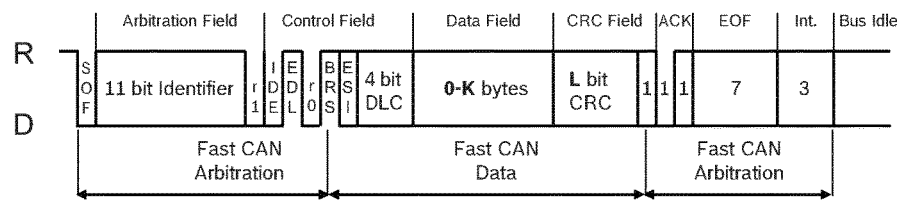
FIG. 6 shows identification of messages having a shortened bit length according to example embodiment of the present invention.
Figure 6:
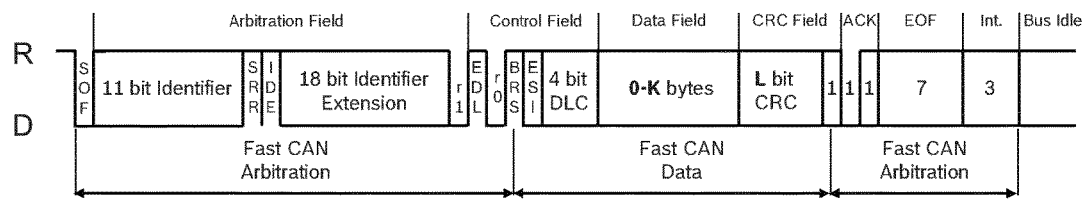

Another possibility for identifying the messages having a shortened bit length in accordance with the present invention is shown in FIG. 6. Here, the messages having potentially longer data fields (associated: first identification K1) and modified CRC calculation (associated: third identification K3) are indicated by a recessive extended data length (EDL) bit, which takes the place of a bit transmitted dominantly in standard CAN messages and replaces this bit or shifts it backwards by one position. For the standard addressing, the EDL bit assumes the second position in the control field and shifts the always dominant r0 bit located there by one position. For the extended addressing, the EDL bit, in the example shown, assumes the first position of the control field and replaces the reserved r1 bit located there, which is always transmitted dominantly in standard CAN. The fourth identification K4, which announces the use of the shortened bit length, is represented by the insertion of an additional, recessive bit rate switch (BRS) bit into the control field of messages according to the present invention, which are indicated by the EDL bit. In the example embodiment shown here, the position of the BRS bit is the fourth (standard addressing) or third (extended addressing) position in the control field.

The messages bear the label "CAN FD Fast." For the two possible addressing variants of messages, the standard format and the extended format, areas are drawn in in FIG. 6, in which a switchover is made between two states indicated as Fast CAN Arbitration and Fast CAN Data. This switchover between the two states has the effect, as already described, that the bit lengths are shortened for the corresponding part of the message and thus the individual bits are transmitted more quickly across the bus. This makes it possible to shorten the transmission time for a message compared to the standard-conforming method. The transition between the states of Fast CAN Arbitration and Fast CAN Data occurs in messages that have the first or third identification EDL, as a function of the fourth identification BRS, which signals to the subscribers of the data transmission that the shortened bit length is being used.

In the case shown, in which the first identification EDL is thus followed by the second identification BRS, messages are transmitted in the transmission method according to the present invention, the bit length of the messages is markedly shortened, the data field size of the messages is expandable to values above 8 bytes, and the CRC of the messages is adapted to the larger data field. A substantial increase of the transmission capacity via the bus system is thus achieved while the transmission reliability is at the same time improved.

In the example shown, the faster transmission begins immediately after the transmission of the associated identification and is ended immediately after reaching the bit defined for the reverse switchover or when a reason for starting an error frame was detected.

Figure 7:
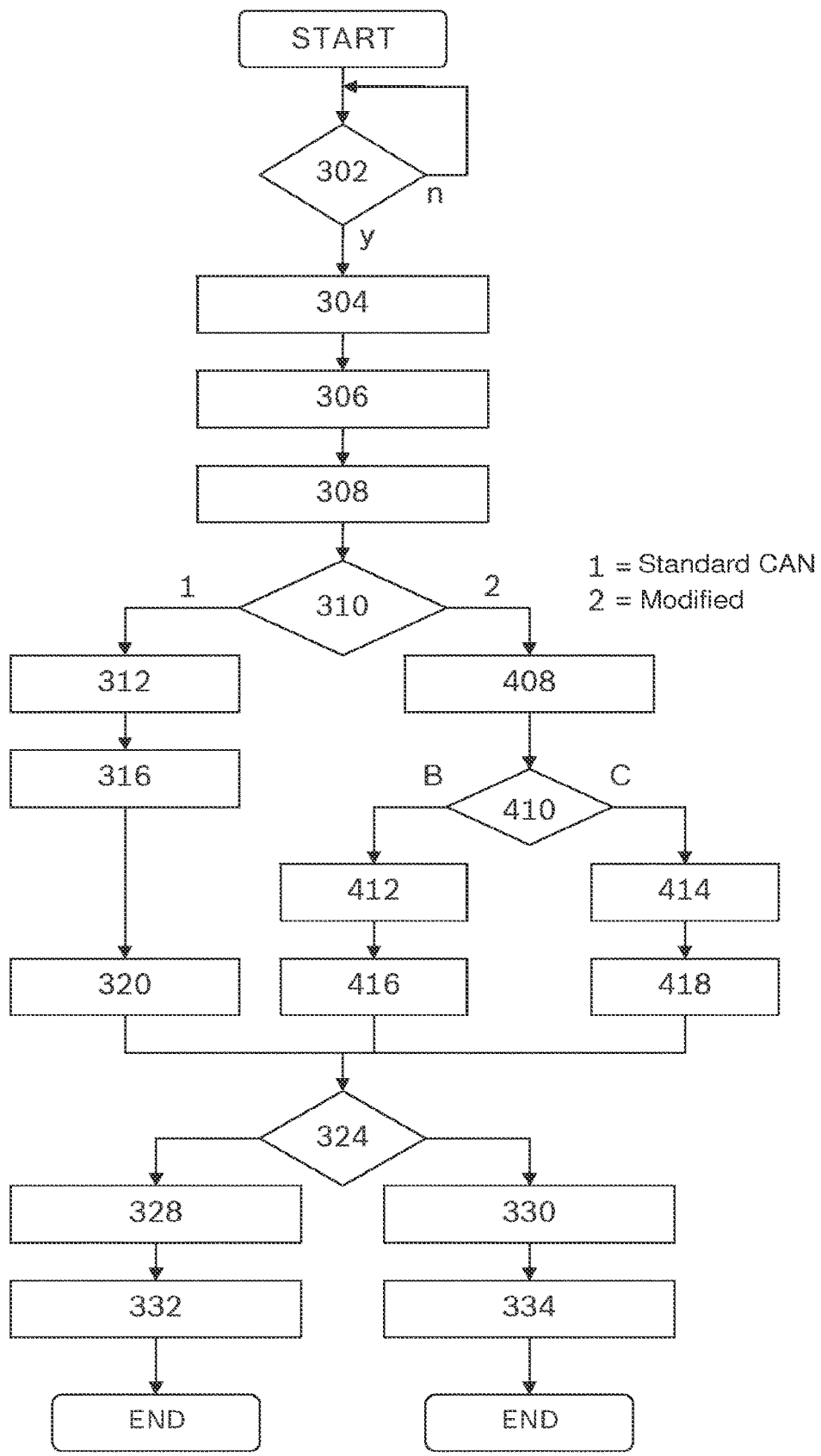
FIG. 7 schematically shows a receiving process in a subscriber station of the bus system, according to an example embodiment of the present invention.

FIG. 7 shows a receiving process that is modified compared to FIG. 3, in which additionally a switchover is made between the states of Fast CAN Arbitration and Fast CAN Data as a function of the second identification BRS. If it is known at branching 310, for example after receiving the second bit of the control field as the recessive EDL bit, that the communication method modified in accordance with the present invention is to be used, then the next bits of the control field are read in in block 408. If the bit used for the second identification, for example the fourth bit BRS of the control field extended in accordance with the present invention, is received with the provided value, for example recessively, then the state Fast CAN Data is assumed for example at the sample point of this bit, that is, a switchover is made to the shortened bit length (path "C"). If the respective bit has the opposite value, that is, dominant in this example, then the bit length is not shortened (path "B"). In blocks 412 or 414, the remaining bits of the control field including the data length code are received as well as the data field according to the size information from the data length code. Reception is at normal bit length in block 412, and at shortened bit length in block 414. In blocks 416 or 418, the CRC field deviating in accordance with the present invention, being in particular longer, is read in. In block 418, at the final bit of the CRC field, the CRC delimiter, a switchover is made back to the state of Fast CAN Arbitration at a normal bit rate. Subsequently, a check is performed at branching 324 analogous to FIG. 3 to determine whether the CRC checksum transmitted by the sender agrees with the CRC checksum ascertained by the receiver, and the further method is selected accordingly, as was already the case in FIG. 3.

The following calculation illustrates the utility in terms of the achieved data transmission rate of the example embodiment shown in FIG. 5 in combination with the example embodiment of the method indicated by DLC 3 having a modified size of the data field, for the case where the data field has a length of 24 bytes, assuming data frames in the standard format featuring 11-bit addressing, as well as a baud rate of 500 kbit/s. Moreover, it is assumed that the scaling factor according to "reserved bit" r0 is increased by a factor of four. In this case, the bit length would thus be reduced from 2 microseconds to 0.5 microseconds according to "reserved bit" r0. Ignoring possible stuff bits, in this example, per data frame, 27 bits (SOF, identifier, RTR, IDE, r0, ACK field, EOF, intermission) are transmitted at the normal bit length and 212 bits (DLC, data, CRC, CRC delimiter) are transmitted at the shortened bit length, a 15-bit CRC having still been assumed here, which, however, in accordance with the present invention could be replaced by a longer CRC.

Under the given boundary conditions, an effective transmission performance of 293 bits in 160 microseconds is achieved, which, at an identical assumed bus capacity utilization, corresponds to a data transmission rate that is increased by a factor of 3.7 compared to unmodified standard CAN transmission. Additionally, the ratio of useful data (data field) to protocol overhead shifts advantageously.

The method is suitable in the normal operation of a motor vehicle for transmitting data between at least two control units of the motor vehicle, which are connected via a suitable data bus. It may also be used advantageously during the manufacturing or maintenance of a motor vehicle for transmitting data between a programming unit connected to a suitable data bus for programming purposes and at least one control unit of the motor vehicle that is connected to the data bus.

It is furthermore also possible to use the method in industrial automation, that is, for example in the transmission of control information between distributed control units interconnected by the bus, which control the course of an industrial manufacturing process. In this environment there may also be very long bus lines and it may be particularly practical to operate the bus system for the arbitration phase at a relatively long bit length, for example at 16, 32 or 64 microseconds, so that the bus signals, as required, are able to propagate through the entire bus system during the arbitration process. Subsequently, a switchover to shorter bit lengths may be performed for part of the message, as described, so as not to let the average transmission rate drop too low.

Overall, the method represents a transmission method that is characterized by the fact that a standard CAN controller only needs to be modified minimally in order to work in accordance with the present invention. A communications controller according to example embodiments the present invention, which is also able to work as a standard CAN controller, is only negligibly larger than a conventional standard CAN controller. The associated application program does not need to be modified, and even then advantages in the speed of data transmission are already achieved. Using the extended size of the data field and the associated DLC and CRC makes it possible to increase the speed of data transmission further, while adaptations in the application software are minimal. Advantageously, substantial portions of the CAN conformance test (ISO 16845) may be adopted. It is also possible to combine the transmission method according to the present invention with the supplements of TTCAN (ISO 11898-4).

What is claimed is:

1. A method for serial data transmission processing in a bus system that includes a bus and at least two subscribed data processing units that are configured to exchange messages via the bus, the method comprising:
   obtaining a message transmitted by one of the at least two subscribed data processing units and on the bus, wherein the message is structured according to a predefined logical structure that includes a start-of-frame bit, an arbitration field, a control field including a data length code, a data field, a CRC field, an acknowledge field, and an end-of-frame sequence;
   determining, by a computer processor, a value of a first switchover condition, the value of the switchover condition being based on one of a bit and a bit combination in the message; and
   based on the determined value of the switchover condition, determining a number of bits included in the CRC field.

2. The method of claim1, wherein the processor is configured for processing CRC fields of a plurality of messages, which CRC fields differ with respect to a respective number of bits included in the respective CRC fields.

3. The method of claim 1, wherein the logical structure is according to the CAN standard ISO 11898-1.

4. The method of claim 1, further comprising:
   determining, based on an identification in at least one of the arbitration field and the control field, whether the message is of a type that the number of bits of the CRC field of which is dependent on the value of the switchover condition.

5. The method of claim 4, wherein the value of the switchover condition is ascertained based on the identification, the message being differently processed depending on the determined number of bits included in the CRC field.

6. The method of claim 5, wherein content of the data length code is also determined based on the identification.

7. The method of claim 1, wherein the value of the switchover condition is ascertained based on content of the data length code, the message being differently processed depending on the determined number of bits included in the CRC field.

8. The method of claim 1, further comprising:
   responsive to obtaining a beginning of the obtained message, initiating calculation of at least two CRC checksums in parallel using different generator polynomials; and
   selecting between respective results of the at least two CRC checksums based on the determined value of the switchover condition.

9. The method of claim 8, wherein one of the CRC checksum calculations is performed using a combination of contents of the CRC field and stuff bits of fields preceding the CRC field, and the stuff bits are not used for another of the CRC checksum calculations.

10. The method of claim 8, further comprising:
    calculating a CRC checksum, wherein, responsive to satisfaction of a condition that the value of the switchover condition meets a predetermined criterion, the calculation of the CRC checksum is performed using a combination of contents of the CRC field and stuff bits of fields preceding the CRC field.

11. The method of claim 1, further comprising:
    determining a value of a second switchover condition;
    interpreting the data length code to determine a length of the data field;
    wherein the interpretation of the data length code is performed according to an assignment of a combination of all values of the data length code to a first range of lengths if the determined value of the second switchover condition is a first value, and the interpretation of the data length code is performed according to an assignment of a combination of all values of the data length code to a second range of lengths if the determined value of the second switchover condition is a second value, the second range including and being larger than the first range.

12. The method of claim 11, wherein the largest length of the first range is 8 bytes and the largest length of the second range is greater than 8 bytes.

13. The method of claim 12, wherein, if the determined value of the second switchover condition is the second value, each possible combination of bits of the data length code is assigned to a different respective data field length than all other combinations of the bits of the data length code.

14. The method of claim 11, wherein the value of the second switchover condition is one of derived from and set to be consistent with the value of the first switchover condition.

15. The method of claim 11, wherein the processor is configured to determine the value of the second switchover condition from an identification in at least one of the arbitration field and the control field.

16. The method of claim 11, wherein, according to the assignments to the first range of lengths and to the second range of lengths, values between 0b0001 and 0b1000 of the data length code are interpreted as respective ones of data field sizes of 1 to 8 bytes, and, according to the assignment to the second range of lengths and not according to the assignment to the first range of lengths, remaining values between 0b1001 and 0b1111 of the data length code are interpreted as respective ones of data field sizes that are greater than 8 bytes.

17. The method of claim 11, wherein the data length code includes four bits and, if the determined value of the second switchover condition is the second value, the four bits of the data length code are interpreted at least partially in deviation from the CAN standard ISO 11898-1.

18. The method of claim 17, wherein the processor is configured to determine from at least one of the arbitration field and the control field whether the message is of a first type for which interpretation of the data length code is to be limited to the first range of lengths or is of a second type for which interpretation of the data length code is expandable to the second larger range of lengths depending on the value of the second switchover condition.

19. The method of claim 1, further comprising:
interpreting the data length code to determine a length of the data field;
wherein the processor is configured to determine from an identification in at least one of the arbitration field and the control field whether the message is of a first type for which interpretation of the data length code is to be limited to a first range of lengths or is of a second type for which interpretation of the data length code is to be expanded to a second larger range of lengths.

20. The method of claim 1, wherein, as a function of a value of a second switchover condition, different values for bit length in time are assigned to different parts of the obtained message.

21. The method of claim 20, wherein the bit length in time assigned to a first part of the message is specified at at least a minimum time value, and the bit length in time assigned to a second part of the message is less than the minimum time value.

22. The method of claim 21, wherein the minimum time value is one microsecond.

23. The method of claim 20, the different values for bit length in time are implemented by using at least two different scaling factors for setting a bus time unit relative to a smallest time unit or to an oscillator clock pulse in ongoing operation.

24. The method of claim 20, further comprising:
based on an identification in at least one of the arbitration field and the control field, determining whether the different values for bit length in time are assigned to the message.

25. The method of claim 24, wherein the identification is also used by the processor to determine at least one of the number of bits included in the CRC field and a range of lengths of the data field to which values of the data length code are assignable.

26. The method of claim 20, wherein whether the different values for bit length in time are assigned to the message is determined based on the value of the second switchover condition, and the value of the second switchover condition is at least one of derivable from and the same as the value of the first switchover condition.

27. The method of claim 1, wherein a first identification bit at least one of indicates the value of the first switchover condition and indicates whether the data field, whose length is indicated by the data length code, can include more than 8 bytes, the first identification bit being an extended data length (EDL) bit positioned between the last bit of the arbitration field and the first bit of the data length code, at a position at which messages that are according to the CAN standard ISO 11898-1 include a bit defined by the CAN standard ISO 11898-1.

28. The method of claim 1, wherein:
a first identification bit indicates the value of the first switchover condition, the first identification bit being an extended data length (EDL) bit positioned between the last bit of the arbitration field and the first bit of the data length code, at a position at which messages that are according to the CAN standard ISO 11898-1 include a bit defined by the CAN standard ISO 11898-1; and
a second identification bit indicates whether the data field, whose length is indicated by the data length code, can include more than 8 bytes, the second identification bit being positioned between the first identification bit and the first bit of the data length code.

29. The method of claim 1, wherein:
a first identification bit indicates the value of the first switchover condition, the first identification bit being an extended data length (EDL) bit positioned between the last bit of the arbitration field and the first bit of the data length code, at a position at which messages that are according to the CAN standard ISO 11898-1 include a bit defined by the CAN standard ISO 11898-1; and
a second identification bit is a bit rate switch (BRS) bit that indicates whether different values for bit length in time are assigned to different parts of the message, the second identification bit being positioned between the first identification bit and the first bit of the data length code.

30. The method of claim 1, wherein the message is one that was transmitted in a time-controlled manner in accordance with the TTCAN standard ISO 11898-4.

31. The method of claim 1, wherein the at least two subscribed data processing units are both control units of one of a motor vehicle and an industrial installation.

32. The method of claim 1, wherein one of the at least two subscribed data processing units is a control unit of one of a motor vehicle and an industrial installation, and the other of the at least two subscribed data processing units is a control unit that is (a) external to the one of the motor vehicle and industrial installation and (b) connectable over the bus to the control unit of the motor vehicle.

33. The method of claim 1, further comprising:
selecting one generator polynomial from at least two different generator polynomials depending on the determined value of the switchover condition; and
using the selected generator polynomial for determining a content of the CRC field.

34. The method of claim 33, wherein, for at least one value of the switchover condition: (a) the number of bits determined to be included in the CRC field is that which conforms to the CAN standard ISO 11898-1, and (b) the selected generator polynomial conforms to the CAN standard ISO 11898-1.

35. A data processing device, which is one of a plurality of data processing devices subscribed to a bus of a bus system for exchanging messages over the bus via serial data transmission, the data processing device comprising:
 a processor configured to:
  obtain a message transmitted on the bus by another of the plurality of data processing devices, wherein the message is structured according to a predefined logical structure that includes a start-of-frame bit, an arbitration field, a control field including a data length code, a data field, a CRC field, an acknowledge field, and an end-of-frame sequence;
  determine a value of a first switchover condition, the value of the switchover condition being based on one of a bit and a bit combination in the message;
  based on the determined value of the switchover condition, determine a number of bits included in the CRC field.

36. The device of claim 35, further comprising:
 a plurality of shift registers, wherein the processor is configured to use the shift registers for calculating content of the CRC field with alternatively selectable generator polynomials, where which of the generator polynomials is selected depends on the value of the first switchover condition.

37. The device of claim 35, further comprising:
 a plurality of shift registers, wherein the processor is configured:
  responsive to obtaining a beginning of the obtained message, initiate calculation of at least two CRC checksums in parallel using different generator polynomials and using the shift registers; and
  select between respective results of the at least two CRC checksums based on the determined value of the first switchover condition.

38. The data processing device of claim 35, wherein the processor is further configured to:
 select one generator polynomial from at least two different generator polynomials depending on the determined value of the switchover condition; and
 use the selected generator polynomial for determining a content of the CRC field.

39. A method for serial data transmission processing in a bus system that includes a bus and at least two subscribed data processing units that are configured to exchange messages via the bus, the method comprising:
 transmitting a plurality of messages by one of the at least two subscribed data processing units and on the bus, wherein each of the messages is structured according to a predefined logical structure that includes a start-of-frame bit, an arbitration field, a control field including a data length code, a data field, a CRC field, an acknowledge field, and an end-of-frame sequence, and wherein a number of bits included in the CRC field differs between different ones of the plurality of messages depending on a value of a switchover condition that is based on one of a bit and a bit combination in at least one of the messages.

40. The method of claim 39, wherein one generator polynomial is selected from at least two different generator polynomials depending on the determined value of a switchover condition, and wherein the selected generator polynomial is used for determining a content of the CRC field.

* * * * *